US007001641B2

(12) United States Patent
Dubin et al.

(10) Patent No.: US 7,001,641 B2
(45) Date of Patent: Feb. 21, 2006

(54) SEED LAYER TREATMENT

(75) Inventors: Valery M. Dubin, Portland, OR (US); Christopher D. Thomas, Aloha, OR (US); Vinay B. Chikarmane, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 277 days.

(21) Appl. No.: 10/252,306

(22) Filed: Sep. 23, 2002

(65) Prior Publication Data
US 2004/0058139 A1 Mar. 25, 2004

(51) Int. Cl.
B05D 3/04 (2006.01)
B05D 3/10 (2006.01)
C25D 5/34 (2006.01)

(52) U.S. Cl. ............... 427/305; 427/301; 427/304; 427/337; 427/377; 205/205; 205/223

(58) Field of Classification Search ........... 427/301, 427/304, 305, 98.1, 98.2, 337, 377; 205/205, 205/223
See application file for complete search history.

(56) References Cited

U.S. PATENT DOCUMENTS 5,891,513 A * 4/1999 Dubin et al. ............... 438/633
6,348,410 B1 * 2/2002 Ngo et al. .................. 438/660
6,423,200 B1 * 7/2002 Hymes ....................... 205/123
6,472,023 B1 * 10/2002 Wu et al. ................... 427/430.1
6,486,560 B1 * 11/2002 Lopatin ...................... 257/762
2003/0075808 A1 * 4/2003 Inoue et al. ................ 257/774

FOREIGN PATENT DOCUMENTS

WO  WO 200178123 A1 * 10/2001

OTHER PUBLICATIONS

J.P. Lu, et al. "Understanding and Eliminating Defects in Electroplated Cu Films", IEEE (2001) ppgs. 280-282.
Junhwan Oh, et al. "Plasma Pretreatment of the Cu Seed Layer Surface in Cu Electroplating," Materials Chemistry and Physics 73 (2002) ppgs. 227-234.

* cited by examiner

Primary Examiner—Stephen Stein
(74) Attorney, Agent, or Firm—Blakely, Sokoloff, Taylor & Zafman LLP

(57) ABSTRACT

Seed layer treatment to remove impurities in the seed layer that might lead to the formation of voids in interconnect circuit features. In one embodiment, the seed layer is heated in a reducing environment. In another embodiment, the seed layer is washed with a surfactant that is compatible with a surfactant used when forming the remainder of the circuit feature on the seed layer. Yet another embodiment combines both techniques.

23 Claims, 6 Drawing Sheets

SEED LAYER TREATMENT

BACKGROUND

1. Technical Field

An embodiment of the present invention relates to integrated circuit manufacturing, and in particular to a seed layer used to form an interconnect feature in an integrated circuit and/or package substrate.

2. Description of the Related Art

In the fabrication of a die from a wafer, various materials may be deposited on a substrate of the wafer for various purposes. For example, a metal layer may be deposited on a patterned substrate to form interconnect features such as metal lines. The patterned substrate may include trenches within which the metal lines are formed.

The substrate is generally of monocrystaline silicon material, such as silicon dioxide. The trenches may be defined within a silicon based inter-layer dielectric (ILD) material including an abundance of silicon, oxygen, and carbon elements. Additionally, a barrier layer may line the trenches to prevent ion migration from the metal lines to outside of the trenches during operation of the completed integrated circuit. For example, the barrier layer may include tantalum where the metal lines are to be of copper.

In order to ensure adequate adhesion between the materials of the substrate defining the trench as described above, a seed layer may initially be deposited within the trenches. The seed layer generally includes the same metal that is to form the metal lines. Alternatively, an alloy of the metal may be used to form the seed layer.

The seed layer is generally quite thin. For example, the seed layer may be between about 10 angstroms and about 3,000 angstroms in thickness. By way of comparison, the complete metal lines to be formed will fill the trenches and may be between about 0.05 microns and about 20 microns.

The seed layer described above may be carefully deposited, for example, by atomic layer deposition (ALD). In this manner, thin and uniform seed layers are formed that adhere to the silicon or other materials defining the trenches as described above. Additionally, the seed layer may includes material similar to that of the metal lines. For example, the seed layer and the metal lines may both include copper. Therefore, the material to form the remainder of the metal lines adequately conforms with, and adheres to, the seed layer when deposited thereon. The seed layer thus acts as an adhesive interface between the materials of the substrate or barrier layer and the metal lines.

Following deposition of the seed layer, the substrate is generally transferred to a metalization reactor for plating of the material to form the remainder of the metal lines. Unfortunately, as the substrate is transferred, the thin and delicate seed layer is often contaminated. For example, the seed layer, primarily of a metal material, may oxidize as it is exposed to air during the transfer. Additionally, contamination with organic material may occur, for example from the person transferring the substrate. Such contamination may result in defects which affect deposition of the material to form the remainder of the metal lines. In fact, the metal lines formed over such defects are prone to include voids. These voids may prevent transmissions through the metal lines, rendering the metal lines useless. A die formed which includes such defects may fail testing and be discarded.

In order to prevent defects in the seed layer as described above, attempts have been made to clean the seed layer and remove contaminants prior to formation of completed metal lines. For example, the substrate with seed layers may be placed in a cleaning solution and rinsed prior to deposition of the remainder of the metal line material. Unfortunately, surfactants of the cleaning solution are often incompatible with substances used during the deposition of the remainder of the metal line material. As a result, the metal lines are still likely to include voids, rendering them useless. In another attempt to remove contaminants from the seed layer prior to formation of metal lines, the substrate may be heated to temperatures in excess of about 300° C. Unfortunately, this may damage the thin and delicate seed layer. Further, even upon exposure to such temperatures, certain contaminants as described above are likely to remain on the seed layer.

BRIEF DESCRIPTION OF THE DRAWINGS

The invention may be understood by referring to the following description and accompanying drawings that are used to illustrate embodiments of the invention.

In the drawings.

DETAILED DESCRIPTION

In the following description, numerous specific details are set forth. However, it is understood that embodiments of the invention may be practiced without these specific details. In other instances, well-known structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

In various embodiments, a seed layer is treated to reduce contaminants before plating. In one embodiment a seed layer may be heated while in a reducing environment. In another embodiment, a seed layer may be exposed to a surfactant that is compatible with a surfactant used when forming a completed circuit feature on the seed layer. While embodiments may be described with reference to a seed layer for a metal line, the embodiments are applicable to a seed layer for other configurations of interconnect features.

Figure 1:
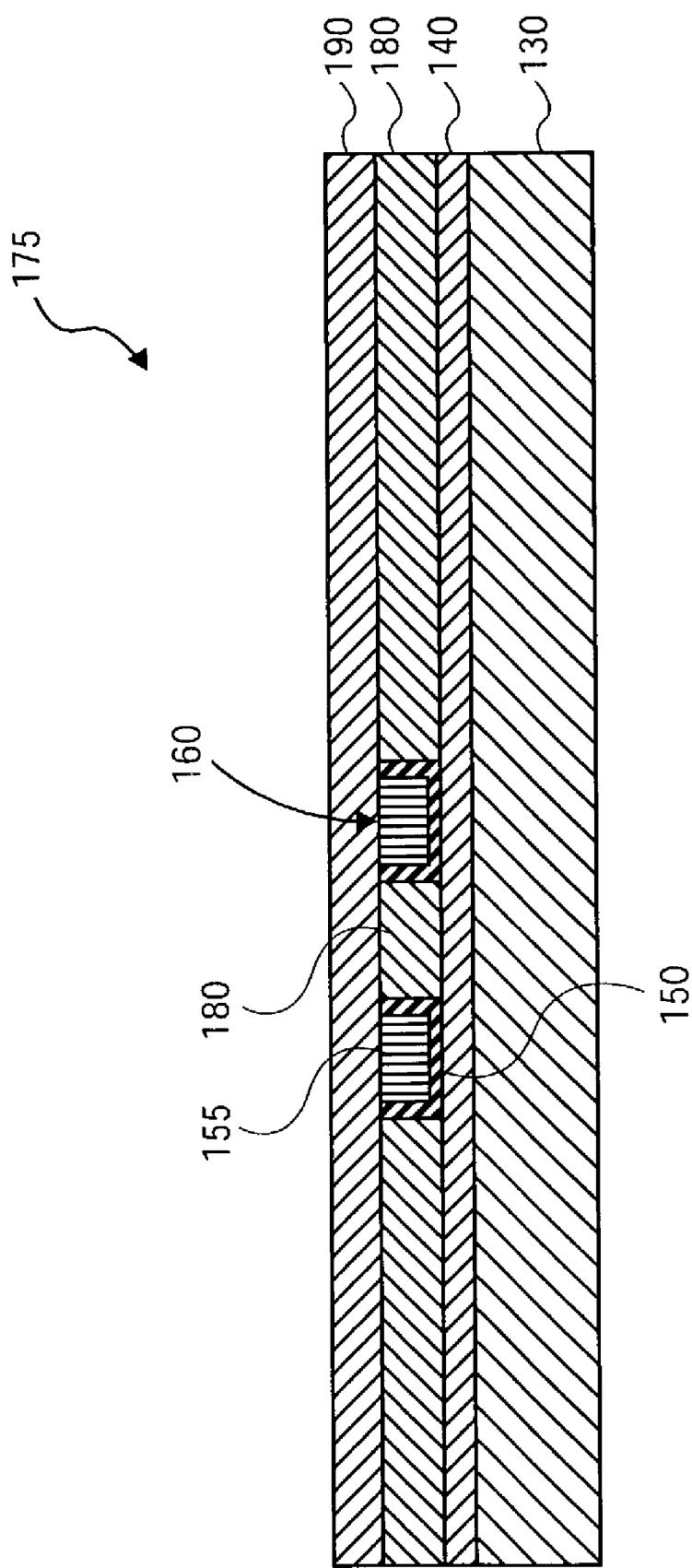
FIG. 1 is a side cross-sectional view of a die including metal lines with treated seed layers, according to one embodiment of the invention.

Referring now to FIG. 1, a side cross-sectional view of a die 175 is shown. The die 175 includes a substrate 130 which may be of conventional polycrystalline silicon materials such as silicon dioxide, or other materials. The die 175 may be formed from a wafer that is processed and sawed or sliced into individual dice such as the die 175.

An etch stop layer 140 may be provided above the substrate 130. The etch stop layer 140 may be of silicon based materials such as silicon carbide or silicon nitride, having greater resistance to subsequently introduced chemical etchants as described below.

Chemical etchants may be used for etching through an inter-layer dielectric (ILD) 180 above the etch stop layer 140. In this manner, circuit features such as trenches for metal lines 160 may be etched into the ILD 180, with other materials subsequently deposited into the trenches to form a treated seed layer 150 and conductive material 155 above the etch stop layer 140. As described below, numerous circuit features may be formed utilizing a treated seed layer 150. Metal lines 160 in particular are shown in FIG. 1. However, other circuit features such as filled interconnect vias may be employed which utilize a treated seed layer 150.

In one embodiment, the ILD 180 contains material having a dielectric constant (k) below about 4. Such materials may include conventional low k materials including silicon, carbon and oxygen. The low k characteristics of the ILD 180 may reduce capacitive effects on signals transmitted through the interconnect features. An additional layer 190 may be deposited above the ILD 180. The additional layer 190 may actually include multiple layers, any of which may also include ILD material and interconnect features.

In one embodiment, the treated seed layer 150 may be between about 10 angstroms and 3,000 angstroms in thickness. Additionally, the treated seed layer 150 may be formed by conventional techniques such as atomic layer deposition (ALD), physical vapor deposition (PVD), chemical vapor deposition (CVD), a form of CVD known as plasma enhanced chemical vapor deposition (PECVD), or by other known or yet-to-be-discovered techniques.

Figure 4:
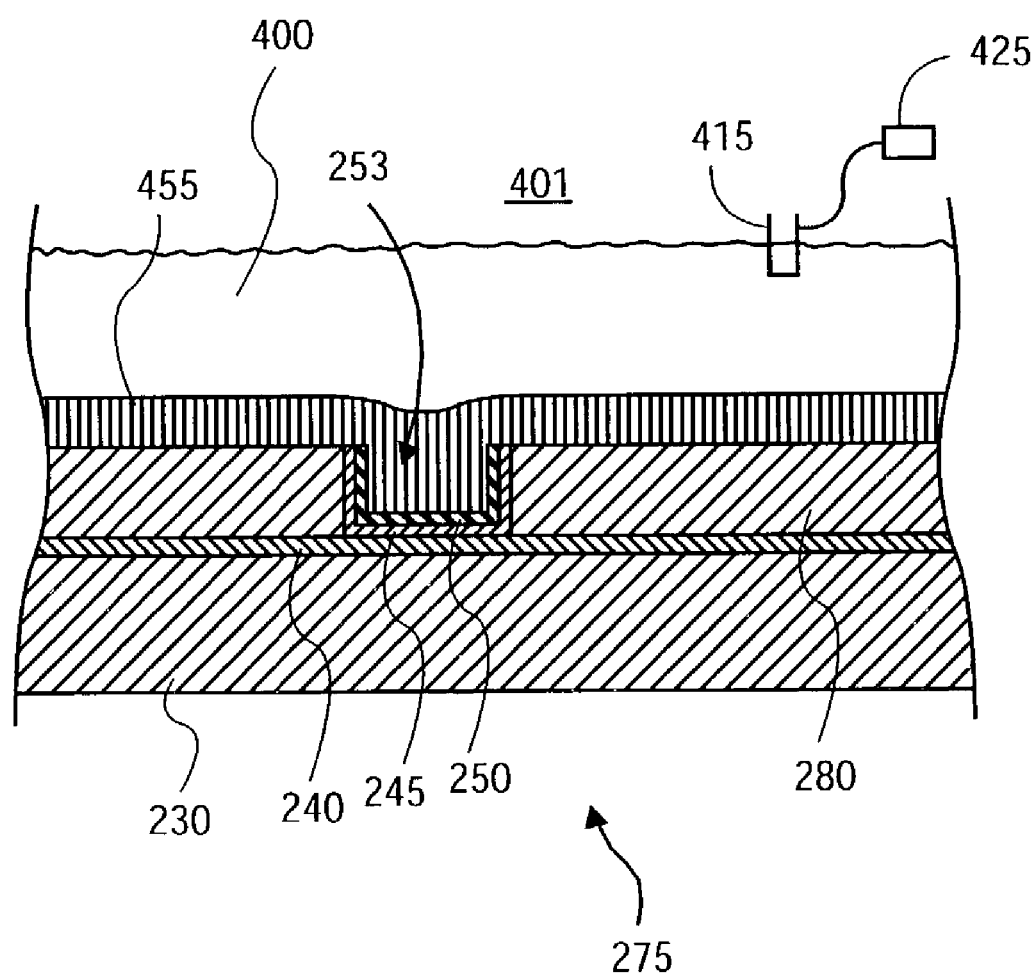
FIG. 4 is a side cross-sectional view of the die of FIG. 3 with a treated seed layer in an electroplating bath to form a metal layer, according to one embodiment of the invention.
Figure 5:
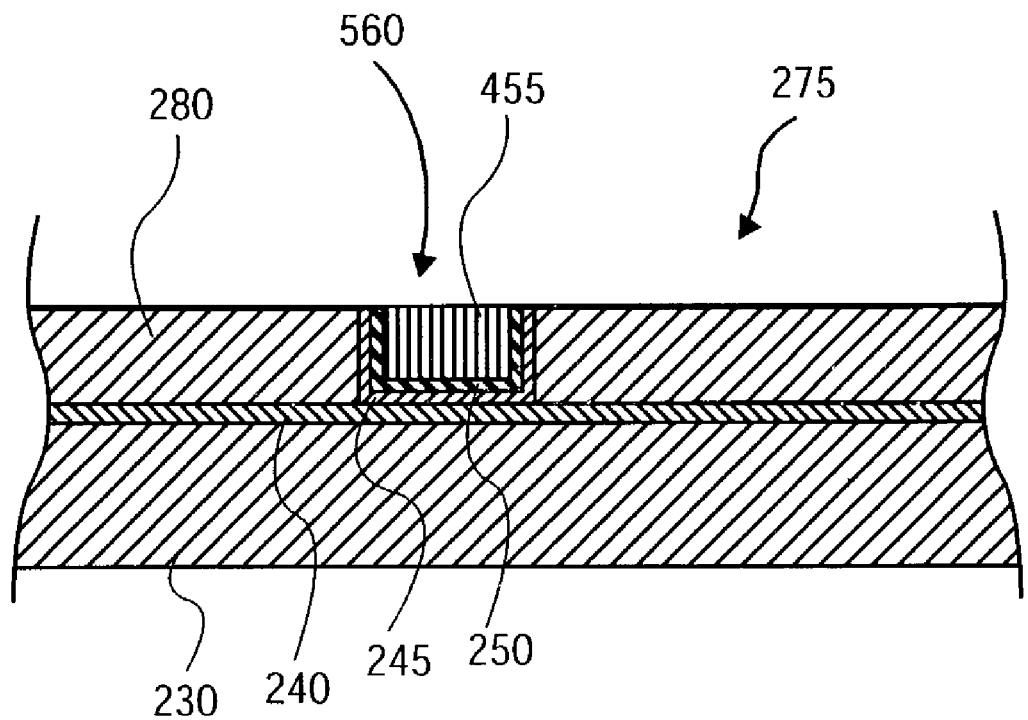
FIG. 5 is a side cross-sectional view of the die of FIG. 4 with isolated metal lines including the treated seed layer, according to one embodiment of the invention.
Figure 6:
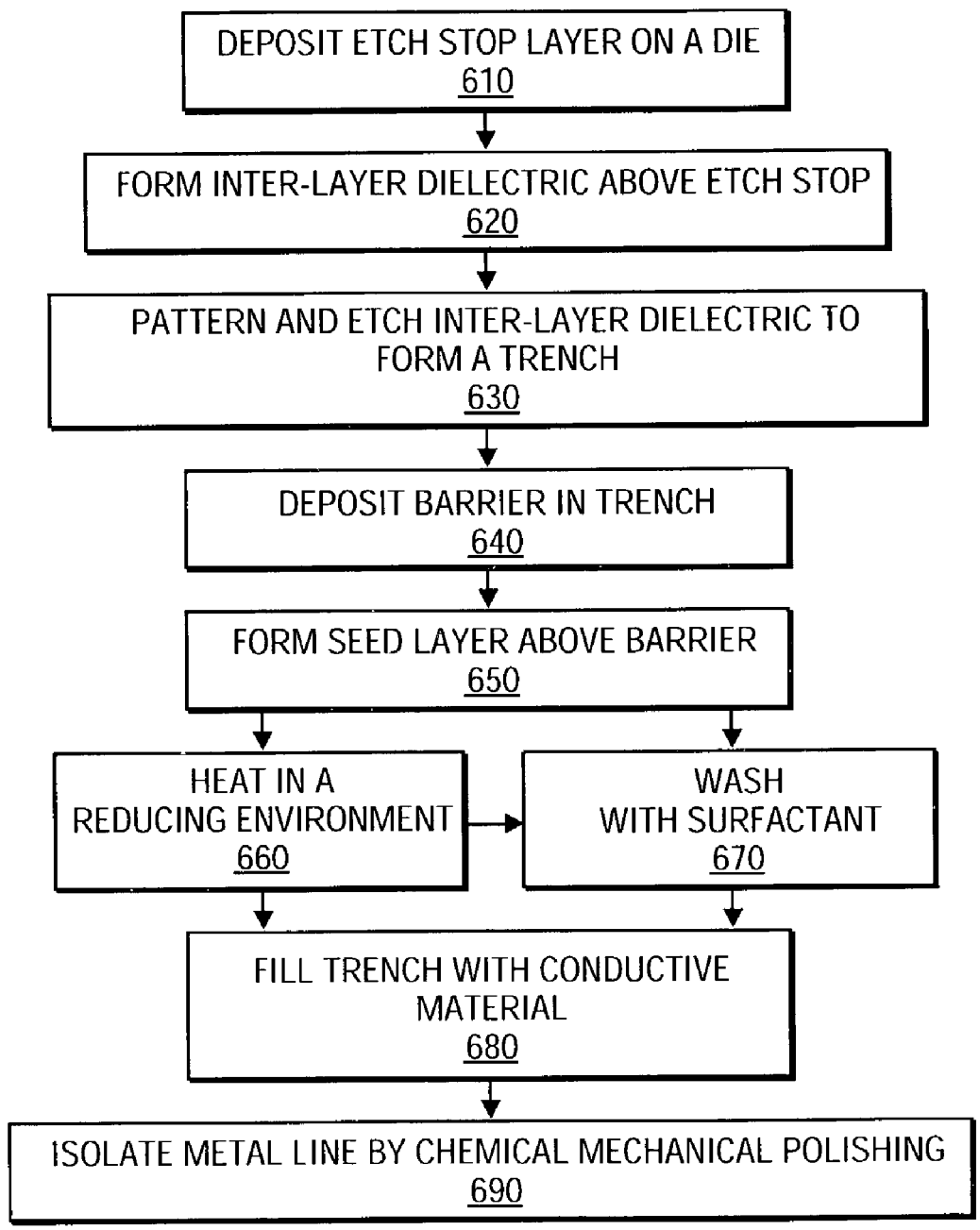
FIG. 6 is a flow chart of a method of forming a die with isolated metal lines having a treated seed layer, according to one embodiment of the invention.

Referring to FIGS. 2–5, methods of forming circuit features such as a metal line 560 (see FIG. 5) including a treated seed layer 250 are described. FIG. 6 is a flowchart summarizing embodiments of forming such metal lines. FIG. 6 is referenced throughout the remainder of the description as an aid in describing these embodiments. While particular circuit features are described in the form of metal lines including particular treated seed layers, additional circuit features, such as interconnect vias filled with conductive material may be formed that are lined with treated seed layers and within the scope of these embodiments.

Figure 2:
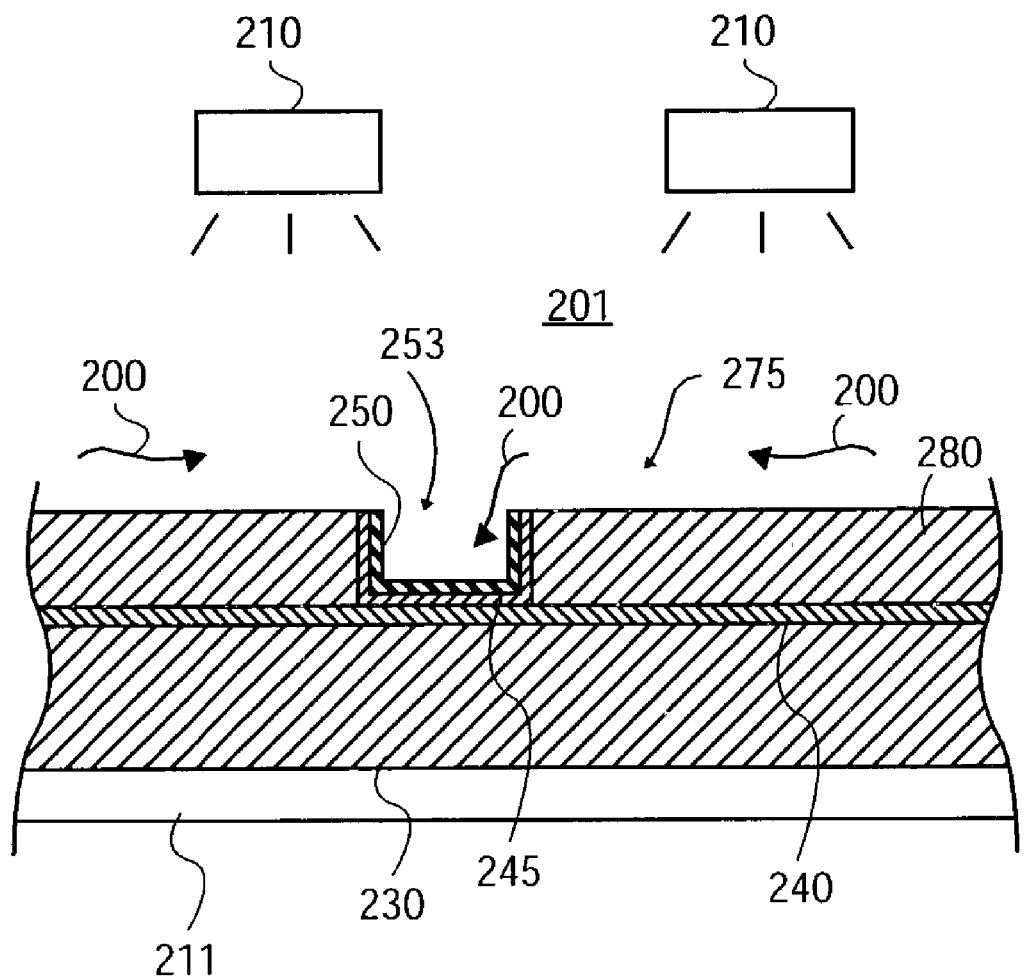
FIG. 2 is a side cross-sectional view of a die in an annealing chamber and having a treated seed layer, according to one embodiment of the invention.

Continuing with reference to FIG. 2, a wafer 275 is shown. FIGS. 2–5 make reference to processing methods applied to the wafer 275. In the illustrated embodiment the wafer 275 includes a substrate 230 which may be of monocrystaline silicon such as described above with reference to FIG. 1.

As shown at blocks 610 and 620 of FIG. 6, subsequent layers, including an etch stop layer 240 and an ILD 280 may be deposited or formed above the substrate 230 of the wafer 275. The etch stop layer 240 and the ILD 280 may be formed by various techniques. For example, in one embodiment PECVD processes are utilized to form the etch stop layer 240 and the ILD 280.

In the embodiment described above, the substrate 230 may be placed in a PECVD apparatus where a gas mixture including materials to form the etch stop layer 240 are introduced. Radio frequency (RF) electromagnetic energy may be applied through the PECVD apparatus to excite the gas mixture to a plasma state, causing deposition of the etch stop layer 240. The process may proceed within the PECVD apparatus at various pressures, temperatures, and power. For example, in one embodiment, pressure is maintained between about 2.0 Torr and about 10.0 Torr, a temperature is maintained between about 250° C. and about 450° C., and RF power is maintained between about 1,600 watts and about 1,800 watts. Similarly, the substrate 130 may then be placed in another apparatus where the ILD 280 is formed utilizing other parameters.

Once the etch stop layer 240 and the ILD 280 have been formed, the ILD 280 may be patterned and etched to accommodate circuit features as shown at block 630. In the embodiment shown, the ILD 280 may be patterned to form a trench 253. The trench 253 may then be used to accommodate a circuit feature in the form of a metal line 560 (see FIG. 5) as described further herein.

In one embodiment the trench 253 is formed by a conventional etching process which may include placement of a patterned photomask on the ILD 280. The photomask may be resistant to conventional chemical etchants and susceptible to deterioration upon exposure to certain energy forms such as ultraviolet light. A photomasking tool may deliver a pattern of ultraviolet light to the photomask leaving it patterned to protect certain portions of the ILD 280 and leaving other portions of the ILD 280 uncovered where a trench 253 is to be formed. A chemical etchant may then be delivered to the exposed surface areas of the ILD 280 to etch those areas down to the etch stop layer 240, forming the trench 253 shown. The remaining photomask material may then be removed. Patterning and etching features with the use of a photomask is well known, and this process has been omitted from the figures for clarity.

As indicated at block 640 of FIG. 6, once the feature (e.g., trench, via, etc.) has been etched into ILD 280, a barrier 245 may be deposited in the trench 253 by various techniques. Masking, such as the photomasking described above, may be used to limit deposition of the barrier 245 to within the trench 253. The barrier 245 may be of conventional materials and configured to help prevent migration of ions of the metal line 560 (see FIG. 5) into areas beyond the metal interconnect during operation of the circuit after manufacture. For example, in an embodiment where the metal line 560 is to include copper, as described further herein, the barrier 245 may include tantalum or titanium based materials, which are highly effective barrier materials with respect to copper. Tantalum based materials may include tantalum, tantalum nitride, and tantalum silicon nitride. Titanium based materials may include titanium nitride, and titanium silicon nitride. The deposition of barrier layers is well known and is not further described to avoid obscuring details of various embodiments of the invention.

Continuing with reference to FIG. 2, and as indicated at block 650 of FIG. 6, a seed layer 250 is formed within the trench 253 and above the barrier 245. The seed layer 250 may be deposited by various techniques. For example, in one embodiment the treated seed layer 250 is deposited in the same manner as the barrier 245 (e.g., by PECVD in this embodiment). In another embodiment, the seed layer 250 may be formed using ALD to create a seed layer that is quite thin (e.g., between about 10 angstroms and about 100 angstroms) or using PVD or CVD to create a seed layer in the thickness range of about 100 angstroms to about 3,000 angstroms.

The seed layer 250 described above may be of copper, a copper alloy, or other conventional electrically conductive circuit or interconnect material. Copper alloys which may be employed to form the treated seed layer 250 may include copper tin, copper indium, and copper aluminum.

The seed layer 250 may help ensure adequate adhesion between the metal line 560 (see FIG. 5) to be formed and the barrier 245. The seed layer may permit the subsequently deposited metal material 455 (see FIG. 4) to adequately adhere to the walls and bottom of the trench 253, which have been lined with the seed layer 250.

Continuing with reference to FIG. 2, the seed layer 250 may oxidize or accumulate organic impurities, for example upon transfer from an ALD reactor for subsequent processing. In the embodiment shown in FIG. 2, the wafer 275 is placed in an annealing chamber 201 which heats the wafer 275 to between about 100° C. and about 300° C. (e.g., to about 150° C.). In this manner, any organic contaminant or impurity on the seed layer 250 may deteriorate or be destroyed without exposing the wafer 275 to hazardous temperatures in excess of about 300° C. This allows for a subsequent washing of the wafer 275, for example, with a wash 300 (see FIG. 3) to readily remove deteriorated organic material from the surface of the seed layer 250. In this manner, organic impurities which might lead to the formation of voids in the subsequently formed metal line 560 (see FIG. 5) may be eliminated.

The annealing chamber 201 shown in FIG. 2 may include heating elements 210 which may be used to heat the wafer 275. The heating elements 210 may include heated coils, a radio frequency electromagnetic energy source, or other source of thermal energy to provide heat to the wafer 275, including the seed layer 250. Additionally, the wafer 275 may be positioned on a platform or susceptor 211 which may also provide heat to the wafer 275 as described above.

While organic impurities may be removed from the seed layer 250 as described above, heat treatment may also be used to remove other contaminants, such as oxidation. For example, as indicated at block 660 of FIG. 6, the wafer 275 may be heated in a reducing environment. That is, a reducing environment may be provided to the wafer 275 within the annealing chamber 201 while it is sealed. In one embodiment, the reducing environment may be provided by the introduction of a reducing gas 200 into the annealing chamber 201. The reducing gas 200 may include hydrogen ions to reduce any oxidized portions of the seed layer 250. For example, embodiments of the reducing gas 200 may include pure hydrogen or ammonia. The reducing gas 200 may also include a volume filler such as nitrogen or argon.

As described above, the seed layer 250 may be treated with heat and exposed to a reducing environment while within the same location of the sealable annealing chamber 201. Therefore, potential organic impurities may be degraded and the oxidation removed, without exposing the seed layer 250 to any additional potential contaminants that might occur if the wafer were to be transferred from one chamber to another between the two treatments. In fact, with reference to FIG. 3, in one embodiment degraded organic impurities may be washed away by placement of the wafer 275 in a wash 300 that is introduced in an environment sealably isolated and coupled to the environment of the annealing chamber 201. However, this is not required. As shown in FIG. 6, in various embodiments the wafer 275 may be heated only, may be washed only, or may be heated and subsequently washed, after forming the seed layer at block 650 but before filling the trench with conductive material at block 680.

Figure 3:
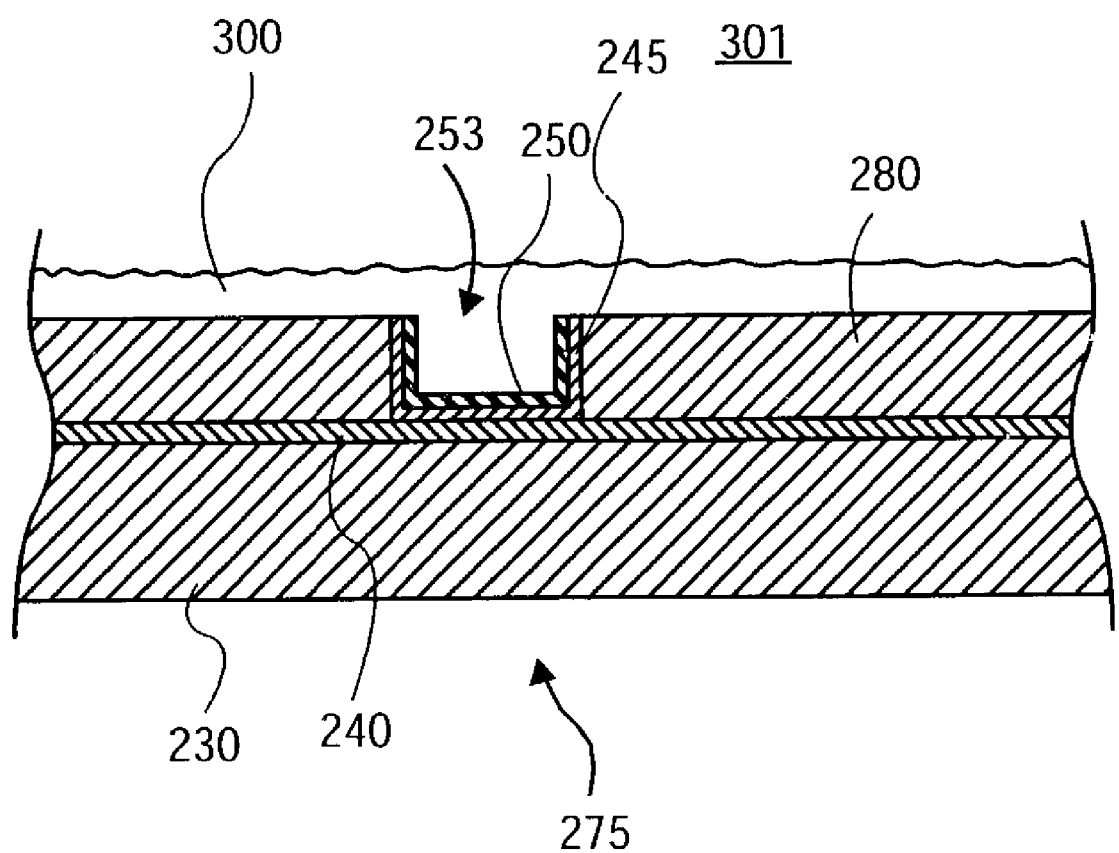
FIG. 3 is a side cross-sectional view of the die of FIG. 2 with a treated seed layer in a rinsing bath, according to one embodiment of the invention.

Referring now to FIG. 3, with additional reference to FIG. 6, the wafer 275 is washed as shown at block 670 within a washing chamber 301. The washing chamber 301 may utilize a wash liquid 300 that may include purified water or other water soluble solvent such as ethylene glycol. In one embodiment the wash liquid 300 may be introduced to the wafer 275 at a rate of between about 0.2 liters/minute (1/m) and about 2 l/m. The wash liquid 300 may be provided for washing away of any deteriorated organic material from the surface of the seed layer 250 as described with reference to FIG. 2. Alternatively, as shown in FIG. 6, the wash process of block 670 may be utilized without the heating process of block 660.

In one embodiment, the wash liquid 300 of FIG. 3 includes a surfactant which may be a polyether surfactant. The surfactant may interact with purified water of the wash liquid 300 to form a detergent to remove any remaining degraded organic impurities on the surface of the seed layer 250. The surfactant may be present in various concentrations (e.g., between about 0.01 gram/liter (g/l) and about 1.0 g/l.)

In one embodiment, washing as described above may proceed for between about 1 second and about 40 seconds, but other times may also be used. In one embodiment, the detergent alone is used to remove organic impurities without prior heating of the wafer 275. In another embodiment, the wafer 275 is dried for up to about 15 seconds following washing. However, this is not required. In fact, in one embodiment, wettability for subsequent electroplating, as described further herein, is improved by intentionally leaving an amount of the wash liquid 300 on the wafer 275 and therefore on the seed layer 250.

Referring now to FIG. 4, the wafer 275 may be placed in an electroplating chamber 401 where it is subjected to an electroplating bath 400. The electroplating chamber 401 may be sealably coupled to the washing chamber 301 to prevent contamination of the wafer 275 upon transfer therefrom. The electroplating chamber 401 may include an anode 415 coupled to a power supply 425 and in contact with the electroplating bath 400.

A current is provided by the power supply 425 to the anode 415. The wafer 275 may act as a cathode to receive metal ions of the electroplating bath 400 on the wafer 275 in the form of a layer of conductive material such as the conductive material 455 shown. In this manner, the trench 253 is filled with the conductive material 455 as indicated at block 680 of FIG. 6. In one embodiment, the electroplating occurs while a pressure of between about 0 psig and about 400 psig is maintained in the electroplating chamber 401. Additionally, a temperature of between about 15° C. and about 30° C. may be maintained in the electroplating chamber 401. In other embodiments, other pressures and temperatures may be used.

In one embodiment the electroplating bath 400 includes metal ions that may be dissolved in a solution of, for example, sulfuric and hydrochloric acids. In a particular embodiment the pH of the acid solution is between about 0 and about 2.0, but other embodiments may use an acid solution outside this range. The metal ions may be copper or other conventional electrically conductive material. Enough conductive material 455 is deposited to fill the trench 253. In this manner, a metal line 560 may be formed as shown and described with reference to FIG. 5.

Continuing with reference to FIG. 4, the electroplating bath 400 may include conventional additives to ensure bottom up fill of the trench 253 with the conductive material 455. Such additives may include a conventional suppressor surfactant and an anti-suppressor disulfide. In one embodiment the suppressor surfactant is present in the electroplating bath 400 at a concentration of between about 0.01 g/l and about 1.0 g/l and the anti-suppressor disulfide is present at less than about 100 ppm, but other amounts may also be used. An organic leveler may also be employed.

In one embodiment, the suppressor surfactant used during electroplating is the same or similar surfactant utilized in the wash 300 described with reference to FIG. 3. For example, the surfactant of the wash 300 and the surfactant of the electroplating bath 400 may both be the same polyether. In this manner, any surfactant remaining in the trench 253 from the wash 300 does not conflict with the surfactant of the electroplating bath 400 to inhibit bottom up fill of the trench 253. In this embodiment, the surfactants of the wash 300 and the electroplating bath 400 may be referred to as non-competing surfactants, i.e., surfactants that when combined do not inhibit bottom up fill during the plating operation. Therefore, wettability is improved and bottom up fill of the trench 253 proceeds smoothly without the formation of voids or defects which may be prone to interrupt transmissions through the metal line 560 once formed (as shown in FIG. 5).

In an embodiment where the conductive material 455 includes copper, a copper salt such as copper sulfate may be dissolved in acids such as the sulfuric and hydrochloric acids noted above. The copper ions may be present in a concentration of between about 10 g/l and about 60 g/l. The copper may be dissolved in a vacuum within a remote mixing chamber prior to introduction to the electroplating chamber 401. In this manner, no air or other impurities are introduced to the wafer 275, thereby avoiding oxidation of walls of the trench 253. Once in the electroplating chamber 401, the positively charged anode 415 may be powered to cause deposition of copper ions from the electroplating bath 400 to the exposed surfaces of the wafer 275 and within the trench 253.

The trench 253 is filled in a manner that substantially avoids the formation of voids. As described above, this may occur due to the use of a surfactant in the electroplating bath 400 which is the same as the surfactant of the wash 300 shown in FIG. 3. Additionally, the presence of a treated seed layer 250, treated as described above with reference to FIGS. 2 and 3, may be of improved wettability and help prevent the formation of such voids.

Although the foregoing embodiments were described with respect to electroplating, other embodiments may use non-electrical techniques to plate the wafer with conductive material.

Referring to FIG. 5, once the conductive material 455 is deposited sufficient to fill the trench 253, planarization may be used to isolate a metal line 560. The metal line 560 is isolated by removal of the conductive material 455 above the trench 253. Isolation of the metal line 560 may be achieved by various techniques, such as by chemical mechanical polishing (CMP) as indicated at block 690 of FIG. 6. CMP may include introduction of a chemical slurry to the surface of the wafer 275. A rotating polishing pad may apply a polishing force to the surface of the wafer 275 and remove the surface material down to a predetermined level, such as down to the surface of ILD 280. In this manner, an isolated metal line 560 is created by removal of all deposited metal that is not in the etched features such as trench 253.

Once the metal line 560 is isolated, the wafer 275 may be subjected to further processing. For example, additional layers may be formed above the metal line 560 and ILD 280. The added layers may include additional ILD material and additional circuit features formed similar to the metal line 560. Further, after fabrication of all layers, the wafer may be sawed into individual dice, each containing the features described herein. Each die may then be physically and electrically coupled to a protective package to form a semiconductor package for coupling to a printed circuit board of an electronic device.

The foregoing text describes various embodiments of the invention as applied to a damascene configuration of interconnects. Additional configurations are also possible. For example, embodiments of the invention may be applied to a dual damascene configuration, in which two adjoining layers of ILD have two layers of features that are contiguous is some places (e.g., a trench in an upper layer connected to a via in a lower layer). As long as the two contiguous features (e.g., the trench and adjoining via) can have seed layers deposited in both features in the same operation, then the seed layers in both may be treated in the same manner at the same time. Alternately, features in a lower level may be etched, deposited with a seed layer, treated, and electroplated, before forming an upper level and repeating the same processes on the upper level.

The foregoing description is intended to be illustrative and not limiting. Variations will occur to those of skill in the art. Those variations are intended to be included in the various embodiments of the invention, which are limited only by the spirit and scope of the appended claims.

We claim:

1. A method comprising:
   treating a seed layer of a die by washing in a first solution that includes a first surfactant; and
   depositing a conductive material on the seed layer from a second solution that includes a second surfactant, the first surfactant and the second surfactant being non-competing surfactants.

2. The method of claim 1 further comprising:
   partially drying the die following said treating; and
   leaving a portion of the first solution with first surfactant on the die to improve wettability of the seed layer for said depositing.

3. The method of claim 1 wherein the first surfactant and the second surfactant are the same surfactant.

4. The method of claim 1 wherein the first solution includes one of water and ethylene glycol.

5. The method of claim 1 wherein the first surfactant is between about 0.01 grams per liter and about 1.0 grams per liter in the first solution.

6. The method of claim 1 further comprising introducing the first solution to the seed layer at a rate of between about 0.2 l/min. and about 2.0 l/min. for the washing.

7. The method of claim 1 wherein said treating is for between about 1 second and about 40 seconds.

8. The method of claim 1 wherein the second solution includes one of hydrochloric acid and sulfuric acid and a pH of between about 0.0 and about 2.0.

9. The method of claim 1 wherein the second surfactant is between about 0.01 grams per liter and about 1.0 grams per liter in the second solution.

10. The method of claim 1 wherein the second solution includes ions of the conductive material at a concentration of between about 10 grams per liter and about 60 grams per liter.

11. The method of claim 10 wherein the ions are copper ions and the seed layer includes copper.

12. The method of claim 1 further comprising:
    patterning an inter-layer dielectric of the die to form a trench; and
    forming the seed layer in the trench prior to said treating.

13. The method of claim 12 wherein said forming is by one of atomic layer deposition, physical vapor deposition, and chemical vapor deposition, and the seed layer has a thickness of between about 10 angstroms and about 3,000 angstroms.

14. The method of claim 12 further comprising isolating a metal line of the conductive material in the trench by chemical mechanical polishing following said depositing.

15. A method comprising heating a die in a reducing environment, the die accommodating a seed layer exposed to the reducing environment forming a seed layer of a die;
   heating said die and exposing said seed layer to a reducing environment;
   after exposing said seed layer to a reducing environment, depositing a conductive material on said seed layer.

16. The method of claim 15 wherein said heating is to between about 100° C. and about 300° C.

17. The method of claim 15 wherein the reducing environment includes one of a hydrogen gas and an ammonia gas.

18. The method of claim 15 further comprising depositing said conductive material on the seed layer to form a circuit feature of the die.

19. The method of claim 18 wherein the seed layer lines a trench of the die the conductive material is a line material and the circuit feature is a metal line.

20. The method of claim 19 wherein the seed layer and the line material include copper.

21. A method comprising:
   heating a die with an exposed seed layer in a reducing environment;
   treating the seed layer by washing in a first solution with a first surfactant; and
   depositing a conductive material on the seed layer from a second solution with a second surfactant, the first surfactant and the second surfactant being non-competing surfactants.

22. The method of claim 21 wherein the first surfactant and the second surfactant are the same polyether surfactant.

23. The method of claim 21 wherein said heating is to between about 100° C. and about 300° C.

* * * * *